US008500474B2

(12) United States Patent
Zimmermann et al.

(10) Patent No.: US 8,500,474 B2
(45) Date of Patent: Aug. 6, 2013

(54) CABLE/HARNESS TEST CONNECTOR

(75) Inventors: Karl F. Zimmermann, Malibu, CA (US); Timothy H. Kelly, Manhattan Beach, CA (US)

(73) Assignee: CK Technologies, Inc., Camarillo, CA (US)

( * ) Notice: Subject to any disclaimer, the term of this patent is extended or adjusted under 35 U.S.C. 154(b) by 0 days.

(21) Appl. No.: 13/206,422

(22) Filed: Aug. 9, 2011

(65) Prior Publication Data
US 2013/0040484 A1  Feb. 14, 2013

(51) Int. Cl.
*H01R 13/15*  (2006.01)
(52) U.S. Cl.
USPC ......................................................... 439/260
(58) Field of Classification Search
USPC .............. 439/260, 267, 350, 131, 132, 928.1, 439/525, 636, 638, 654, 908, 61, 263–265, 439/153, 268, 160, 259, 266, 270
See application file for complete search history.

(56) References Cited

U.S. PATENT DOCUMENTS

| 4,196,955 | A | * | 4/1980 | Anhalt | 439/267 |
| 4,314,736 | A | * | 2/1982 | Demnianiuk | 439/264 |
| 4,402,563 | A | * | 9/1983 | Sinclair | 439/264 |
| 5,474,462 | A | * | 12/1995 | Yamanashi | 439/157 |
| 6,765,803 | B2 | * | 7/2004 | Farnworth et al. | 361/796 |
| 7,180,031 | B1 | * | 2/2007 | Loibl et al. | 219/203 |
| 7,374,441 | B2 | * | 5/2008 | Rubenstein | 439/160 |
| 8,172,594 | B2 | * | 5/2012 | Brusaca et al. | 439/267 |
| 2005/0003692 | A1 | * | 1/2005 | Allirot | 439/160 |

FOREIGN PATENT DOCUMENTS
WO  WO03090916 A1  10/2003

OTHER PUBLICATIONS

International Search Report and Written Opinion for PCT/US2011/001408, dated Oct. 27, 2011.

* cited by examiner

*Primary Examiner* — R S Luebke
*Assistant Examiner* — Harshad Patel
(74) *Attorney, Agent, or Firm* — Koppel, Patrick, Heybl & Philpott

(57) ABSTRACT

A wiring analyzer system with a zero-insertion-force (ZIF) connector/receiver interface. An electrical connection is made by inserting a male connector into a female receiver slot. During insertion into the female receiver slot, the male connector experiences minimal, if any, resistive force. The female receiver comprises a set of opposing spring contacts designed to pinch both sides of the wafer, making contact with the male connector. A pair of elongated plates has several sections cut out to correspond with each female slot such that when the male connector is inserted between the spring contacts the wafer passes through both plates. In order to create the necessary pinching action, a force is exerted on the plates, causing them to move a distance in opposite directions. This motion brings the plates into contact with the spring contacts, squeezing them together against the wafer and creating a firm contact.

20 Claims, 4 Drawing Sheets

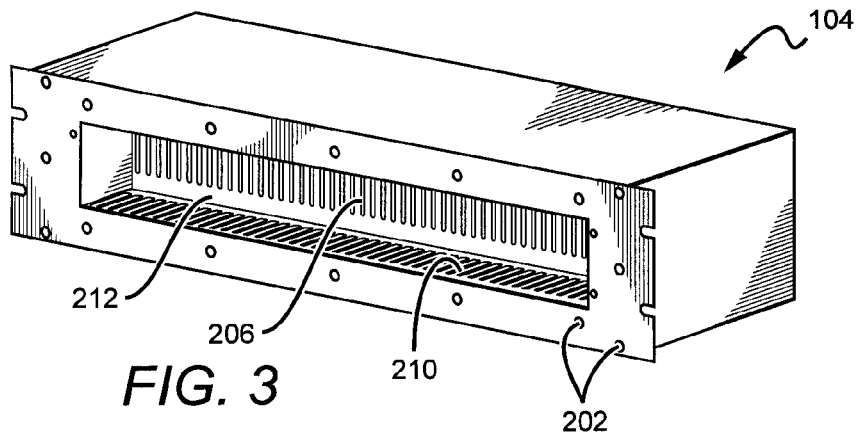
FIG. 3
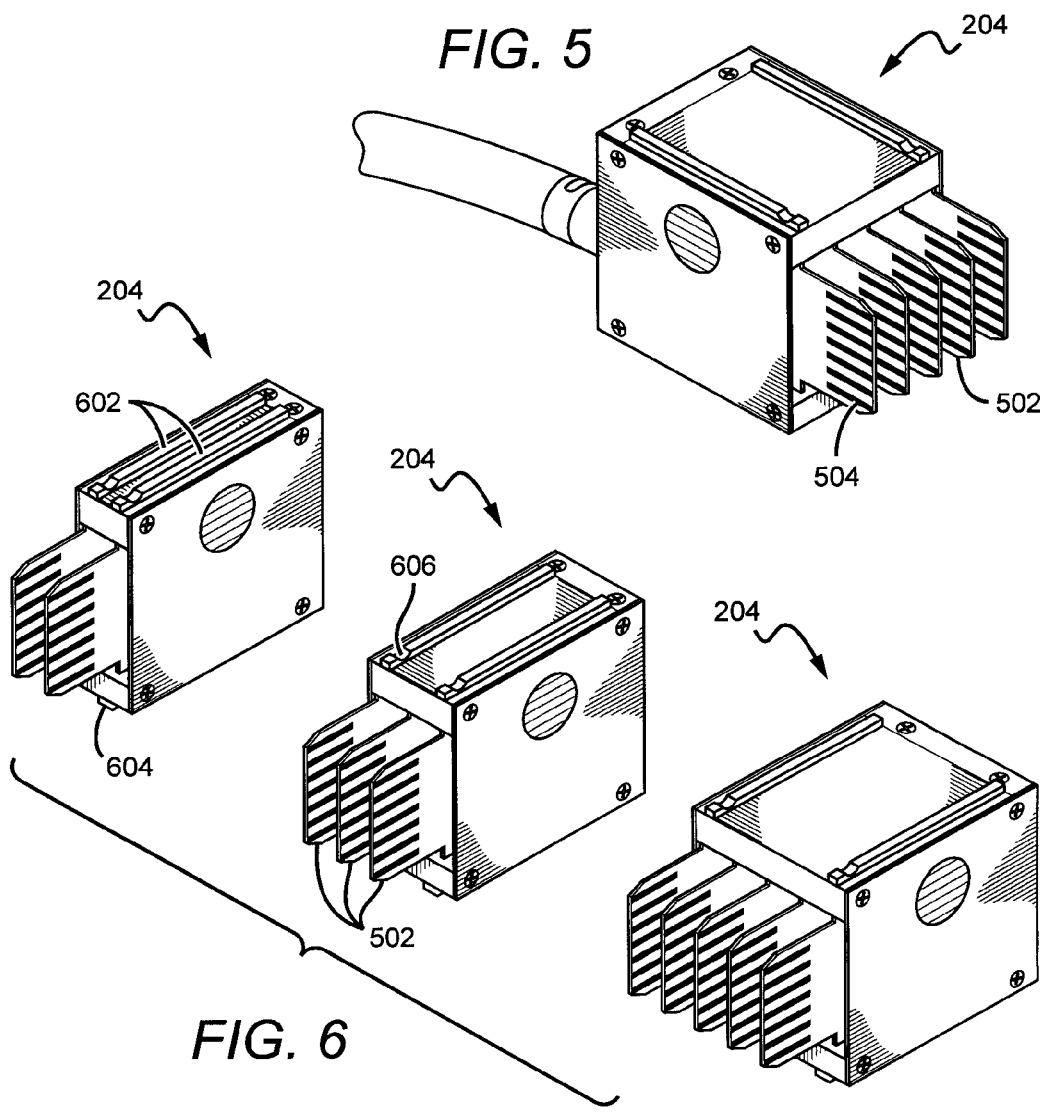
FIG. 5
FIG. 6

CABLE/HARNESS TEST CONNECTOR

BACKGROUND OF THE INVENTION

Field of the Invention

Embodiments of the invention relate to wiring analyzer systems and, more particularly, to zero-insertion-force (ZIF) connector contacting technology and related ZIF adapter connectors used therein.

SUMMARY

A cable connector device according to an embodiment of the present invention comprises the following elements. An interface unit comprises at least one female connector shaped to receive the male end of an adapter cable connector. A first pinch plate comprises a slot that corresponds with the at least one female connector, the first pinch plate mounted such that it can slide laterally along the interface unit. A second pinch plate comprises a slot that corresponds with the at least one female connector, the second pinch plate mounted such that it can slide laterally along the interface unit. At least one pair of opposing contact springs protrudes through the first and second pinch plate slots. Upon actuation at least one of the pinch plates slides a distance to change the position of the first pinch plate relative to the second pinch plate such that the contact springs are urged toward one another.

BRIEF DESCRIPTION OF THE DRAWINGS

FIG. 3 is a perspective view of a female interface unit according to an embodiment of the present invention.

FIG. 5 is a perspective view of a connector according to an embodiment of the present invention.

FIG. 6 is a perspective view of three different connectors according to embodiments of the present invention.

DETAILED DESCRIPTION

Figure 1:
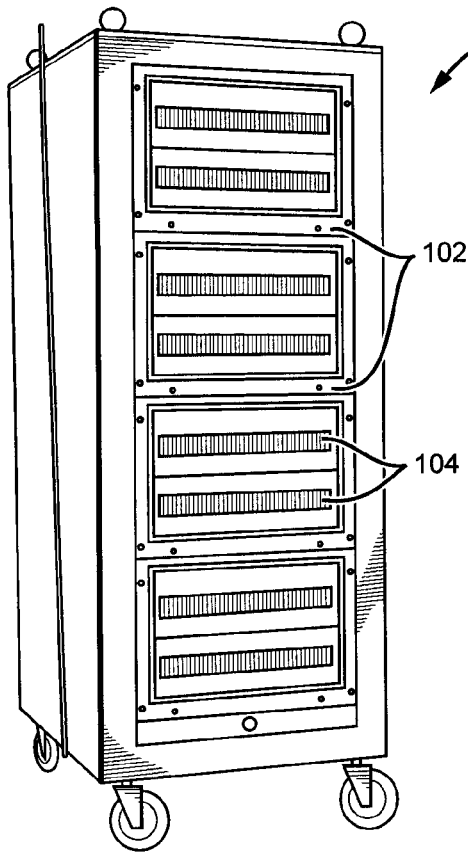
FIG. 1 is a perspective view of a wiring analyzer cabinet according to an embodiment of the present invention.

Embodiments of the present invention provide a wiring analyzer system with a zero-insertion-force (ZIF) connector/receiver interface. An electrical connection is made by inserting a male connector into a female receiver slot. During insertion into the female receiver slot, the male connector experiences minimal, if any, resistive force. Each male connector comprises at least one circuit board wafer which has at least one contact pad for electrical contact on each side of the wafer. The female receiver comprises a set of opposing spring contacts designed to pinch both sides of the wafer, making contact with the contact pads. A pair of elongated plates has several sections cut out to correspond with each female slot such that when the male connector is inserted between the spring contacts the wafer passes through both plates. In order to create the necessary pinching action, a force is exerted on the plates, causing them to move a distance in opposite directions. This motion brings the plates into contact with the spring contacts, squeezing them together against the wafer and creating a firm contact between the spring contacts of the female receiver and the contact pads of the male connector. The ZIF scheme eliminates the normally high forces encountered when engaging the male and female halves of a connector, while at the same time reducing mechanical wear on both the female contact springs and male circuit board wafers. A slight wiping (or sliding) of the contact springs against the male circuit board wafer during engagement ensures a reliable, low resistance electrical connection.

It is understood that when an element is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one element to another. It is understood that these terms are intended to encompass different orientations of the device in addition to the orientation depicted in the figures.

Although the ordinal terms first, second, etc., may be used herein to describe various elements, components, regions and/or sections, these elements, components, regions, and/or sections should not be limited by these terms. These terms are only used to distinguish one element, component, region, or section from another. Thus, unless expressly stated otherwise, a first element, component, region, or section discussed below could be termed a second element, component, region, or section without departing from the teachings of the present invention.

Embodiments of the invention are described herein with reference to several illustrations. As such, the actual size of components can be different, and variations from the shapes of the illustrations as a result, for example, of customization. Thus, the elements illustrated in the figures are representative in nature. Their shapes are not intended to illustrate the precise shape of an element of a device and are not intended to limit the scope of the invention.

FIG. 1 is a perspective view of a wiring analyzer cabinet 100 according to an embodiment of the present invention. The cabinet comprises racks 102 where several female interface units 104 may be housed. The female interface units 104 are designed to receive the male end of an adapter cable connector. The cables may be plugged into a complex circuit that requires testing, such as the electrical system of an airplane, for example. Information is fed through the interface units 104 into the cabinet 100 where the data is processed and formatted for analysis either by an in-unit computer or an external computer that is connected to the cabinet 100.

Figure 2:
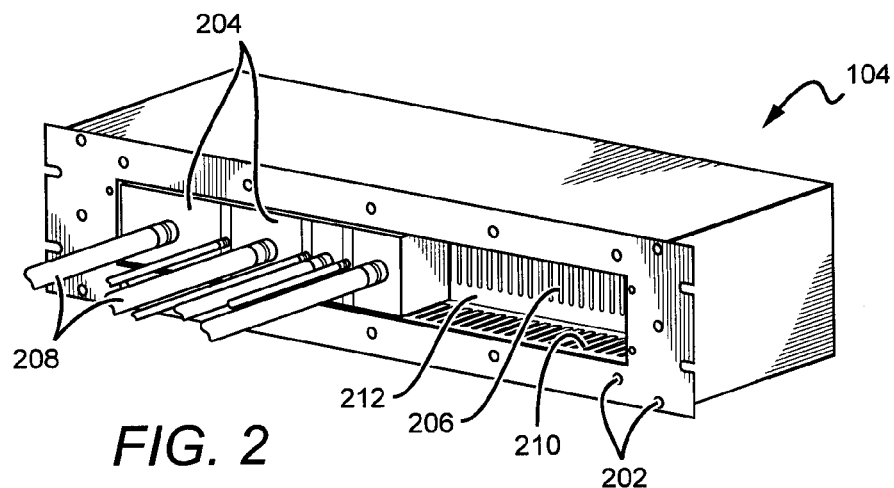
FIG. 2 is a perspective view of an interface unit according to an embodiment of the present invention.

FIG. 2 is a perspective view of a single interface unit 104 which has been removed from the cabinet 100. Each unit 104 is housed in the cabinet 100 during use as shown in FIG. 1 and can be easily removed for maintenance and adjustment. The unit 104 may be mounted in the cabinet using any secure mounting means including screws designed to engage with the cabinet 100 through bore holes 202 such as those shown.

Cables 208 are connected to the interface unit 104 with several male connectors 204 of varying size which are shown plugged into the interface 104. Each connector 204 has at least one circuit board wafer (shown in detail in FIGS. 5 and 6) which can be inserted into one of the interface slots 206. The connectors 204 are easily fed into the interface 104 along a plurality of guide grooves 210 that correspond to each slot 206. A front-side pinch plate 212 is disposed within the recess of the interface 104. The pinch plate 212 has several sections cut away to correspond with each of the receiver slots 206. A back-side pinch plate (not shown in FIG. 2) is obscured by the front side pinch plate 212 in this view.

FIG. 3 is a perspective view of the female interface unit 104 with all of the connectors removed. This particular embodiment comprises fifty receiver slots 206. It is understood that the interface unit 104 can comprise more or fewer slots depending on the desired application.

Figure 4:
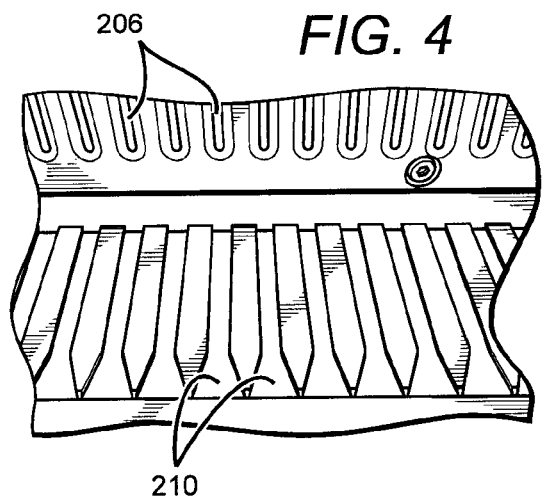
FIG. 4 is a close-up picture view of the bottom portion an interface unit according to an embodiment of the present invention.

FIG. 4 is a close-up picture of the guide grooves 210 and the bottom portion of the receiver slots 206 from an actually built and operational interface unit 104. The guide grooves 210 cooperate with a guide rail that protrudes from the bottom side of the male connector 204 as best shown in FIG. 6. The guide groove/rail combination ensures that the connector 204 is properly aligned with the receiver slot 206 for clean insertion. A notch may be used so that the connector 204 engages the receiver slot 206 with a slight snap-fit action. Guide rails at the top and bottom of the male connectors are of different widths to ensure connector engagement in the proper orientation.

FIG. 5 is a perspective view of a connector 204 according to an embodiment of the present invention. This particular connector 204 comprises five circuit board wafers 502 with each wafer having seven contact pads 504 on each side, for a total of fourteen contact pads 504 per wafer 502. When connected, each contact pad 504 is capable of transmitting a signal from the system being analyzed to the test system.

It is understood that different wafer/contact pad configurations are possible. One or more wafers make up a connector, with each wafer having up to sixty-four contacts, plus an additional two contacts for a connector identification circuit. The number of wafers which can be contained in a connector housing is unlimited, but in practice the number is determined by the maximum wires in an adapter cable to the external system being tested. For example, if the ZIF interface has fifty interface connector positions, with twelve contacts per position, then the mating ZIF connectors will have one, or more, twelve-contact wafers. In this way, the interface will support 500 test addresses, with two ID address contacts per wafer. If the interface has sixteen interface connector positions, with sixty-six contacts per position, then the mating connectors will have one or more wafers with sixty-six contacts per wafer. Thus, the interface will support 1,024 test addresses, plus two ID address contacts per wafer. Thus, virtually any size connector can be constructed.

In some embodiments a connector ID feature may be included. The ID feature (i.e., one dedicated identification contact on each side of each wafer) will permit the insertion of the ZIF connector at any position along the ZIF interface. This will greatly increase testing efficiency as the test technician will not have to refer to documentation specifying where a specific ZIF connector is placed. Instead, the software will simply read the ID embedded in each connector and reorganize the test instructions according to the position of each connector in the ZIF interface.

For example, as shown in FIG. 2, connectors may have a single wafer or many wafers, and each individual wafer may have more or fewer contact pads on one or both sides. FIG. 6 is a perspective view of three different connectors 204 according to embodiments of the present invention. Each connector 204 has a number of circuit board wafers 502 protruding therefrom. The five-wafer embodiment corresponds with the connector 204 shown in FIG. 5. Each of the connectors 204 comprises top- and bottom-side guide rails 602, 604 that cooperate with guide grooves on the interface unit 104 to align the elements during insertion as discussed above. In this embodiment, the top-side guide rails 602 each feature a notch 606 which engages with a portion of the interface unit 104 to provide a snap-fit association. Each connector 204, regardless of the number of wafers 502, comprises two top-side guide rails 602, providing a uniform insertion/extraction force for connectors 204 of all sizes.

Figure 7:
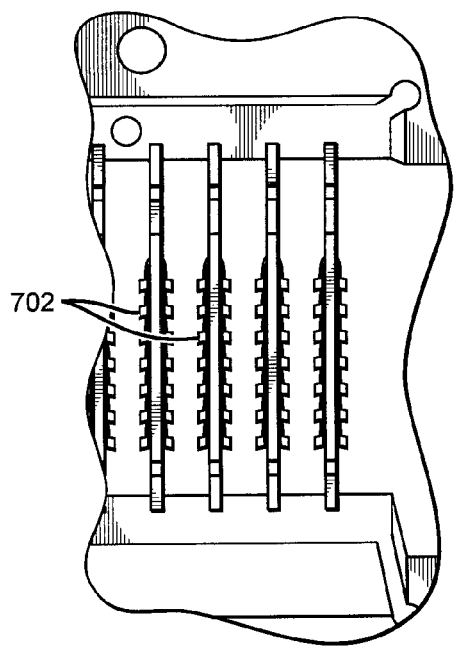
FIG. 7 is a close-up view of a portion of an interface unit according to an embodiment of the present invention.

FIG. 7 is a close-up picture of the receiving slots 206 of an actually built and operational interface unit 104. It is important to note that, for convenience, the slot frame and the pinch plates have been removed to expose the contact springs 702. The contact springs 702 are designed to align with the contact pads 504 on the connector wafers 502. As the connector 204 is being inserted into the slot 206, the contact springs 702 present little, if any, resistance to the wafer 502. However, because the contact springs 702 are not pressed against the pads 504, no reliable electrical connection can be established. Thus, a force is required to urge the contact springs 702 against the pads 504.

Figure 8:
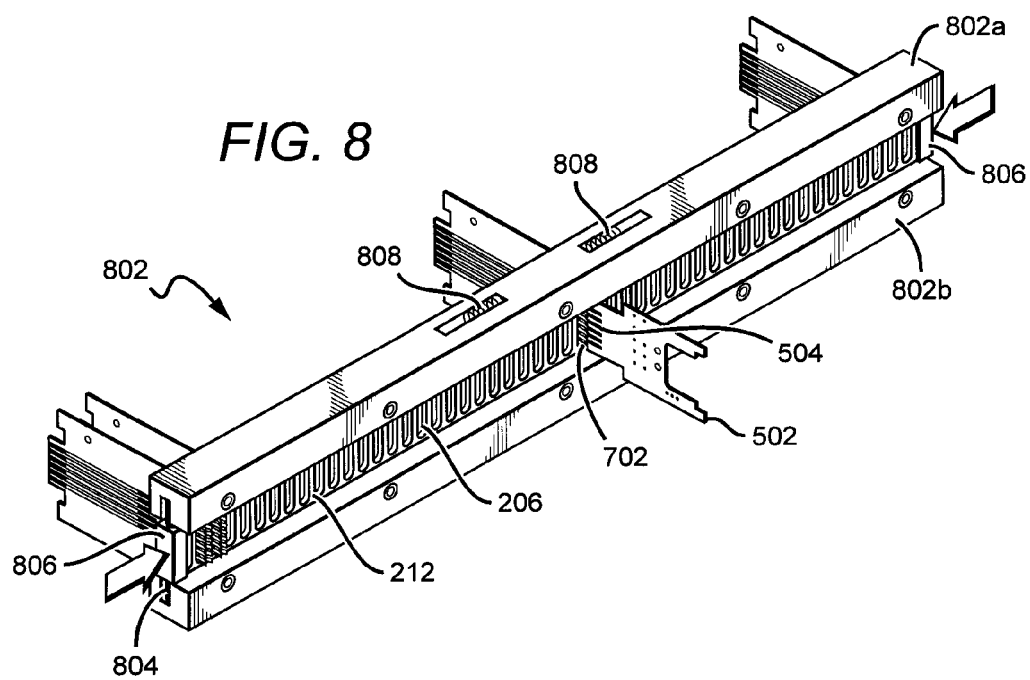
FIG. 8 is a perspective view of a slot frame according to an embodiment of the present invention.

FIG. 8 shows a perspective view of a slot frame 802 according to an embodiment of the present invention. The slot frame 802 has been removed from the interface unit 104 to reveal several internal elements of the device. The slot frame 802 comprises an upper portion 802a and a lower portion 802b arranged in a spaced relationship. Longitudinal slits 804 are cut away down the length of the upper and lower portions 802a, 802b of the slot frame 802. The pinch plates 212 are disposed in the slits 804 and run from end to end of the frame 802. Each pinch plate 212 has a push pad 806 attached to it at one end with the two push pads 806 arranged at opposite ends of the frame 802. To actuate the pinch plates 212, an inward and opposite force is simultaneously applied to the push pads 806 as shown. The force moves the pinch plates 212 along the slits 804 in opposite directions causing the plates 212 to partially close the slots 206 and squeeze the contact springs 702 of the interface unit 104 against the contact pads 504 of the connector wafer 502. The force exerted by the pinch plates 212 on the contact springs 702 must be sufficient to create a reliable electrical connection between the contact springs 702 and the contact pads 504. When the force is removed from the push pads 806, the pinch plates 212 are urged back to the relaxed position by return springs 808.

Figure 9A:
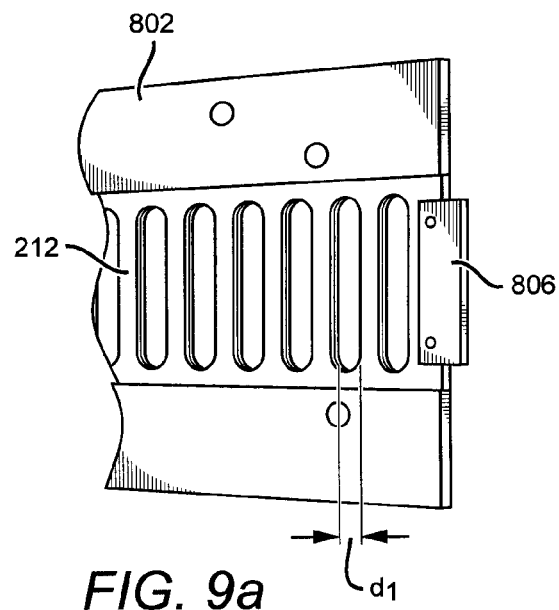
FIG. 9a shows a pair of pinch plates in the full-open position according to an embodiment of the present invention.
Figure 9B:
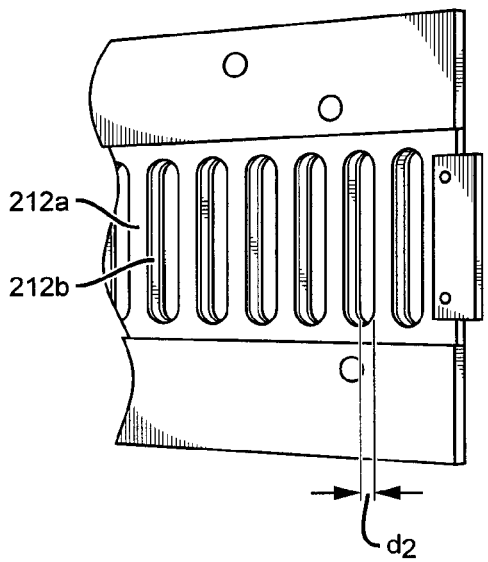
FIG. 9b shows a pair of pinch plates in the partial-closed position according to an embodiment of the present invention.

FIGS. 9a and 9b are close-up pictures of an actually built and operational slot frame 802 according to an embodiment of the present invention. FIG. 9a shows the pinch plates 212 in the full-open position with one plate directly behind the other; that is, no inward force is being exerted by the push pads 806. In this state, the pinch plates 212 are held in the full-open position by the return springs 808. When the pinch plates 212 are in the full-open position, the width of the slots $d_1$ is at a maximum, and the spring contacts 702 are not pressed against the contact pads 504.

In FIG. 9b the pinch plates 212a, 212b are being forced in opposite directions such that the width of the slots $d_2$ is at a minimum. Here, the plates 212a, 212b are in the partial-closed position. When the plates 212a, 212b are in the partial-closed position, the contact springs 702 are pressed against the contact pads 504 (spring contacts and pads not shown in FIG. 9b), and a reliable electrical connection may be achieved. Once the force is released, the pinch plates 212 will be urged by the return springs 808 back into the full-open position.

Figure 10:
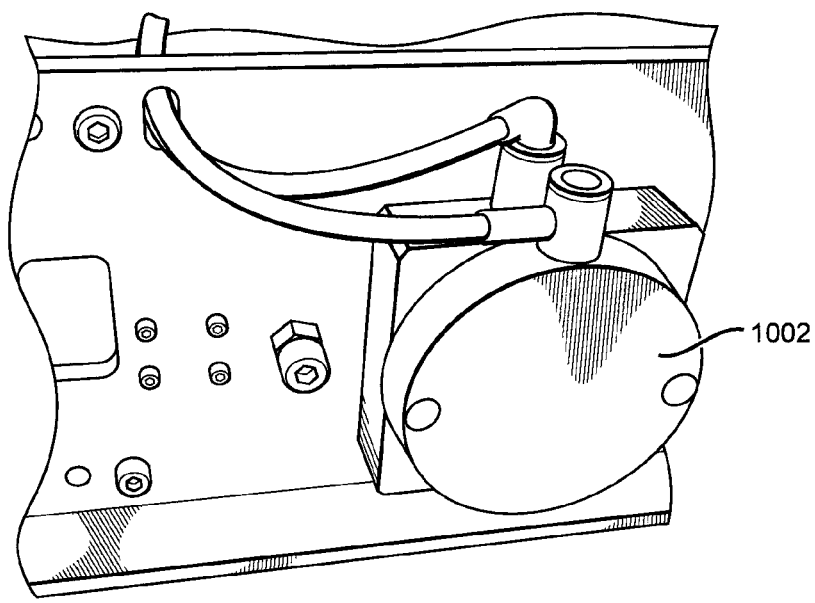
FIG. 10 is a close-up view of an interface unit according to an embodiment of the present invention.

The mechanical force necessary to actuate the pinch plates 212 may be generated in many ways. In one embodiment, the force may be generated using a pneumatic system such as the one shown in FIG. 10. FIG. 10 is a close-up picture of an actually built and operational interface unit 104. A pneumatic cylinder 1002 mounted to the side of the interface unit 104 is used to create the push force. An identical cylinder can be mounted to the opposite side to generate the force needed to move the opposite pinch plate. Pneumatic cylinders are known in the art and therefore only briefly discussed herein. Depending on the particular design, the pneumatic cylinder can create a push force or a pull force.

Figure 11:
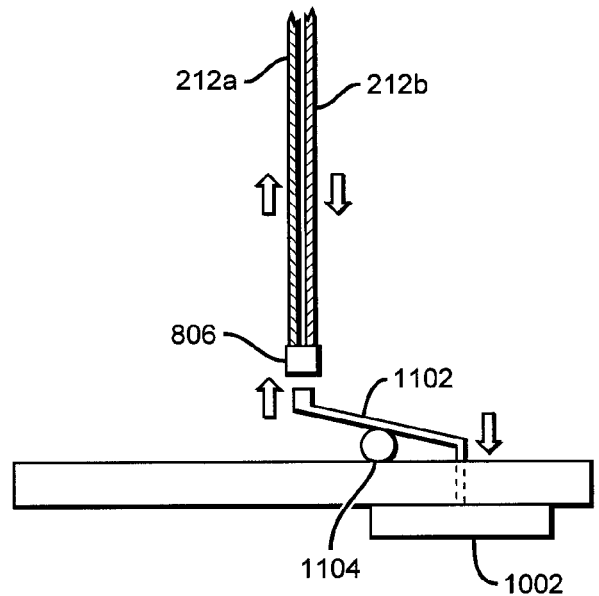
FIG. 11 is a schematic representation of an actuation mechanism according to an embodiment of the present invention.

FIG. 11 is a schematic representation of one actuation mechanism. As shown, the pneumatic cylinder 1002 pulls one end of a lever arm 1102, creating a moment about fulcrum 1104. The moment generates a push force against push pad 806 and forces front-side pinch plate 212a to move in an inward direction. The opposite cylinder causes back-side pinch plate 212b to move in the opposite direction. The use of the lever arm 1102 provides a mechanical advantage based on where the fulcrum 1104 is placed in relation to the push pad 806 and the actuator pin. FIG. 11 is merely schematic and only meant to illustrate the actuation mechanism in a general sense. It should not be construed as limiting the invention to any particular configuration. Furthermore, it is understood that the many different force generation schemes can be used to provide the actuation force. These systems include but are not limited to stepping motors with gear reduction, electromechanical transducers and hydraulic systems.

Although the present invention has been described in detail with reference to certain preferred configurations thereof, other versions are possible. Therefore, the spirit and scope of the invention should not be limited to the versions described above.

We claim:

1. A cable connector device, comprising:
   an interface unit comprising at least one receiver slot shaped to receive a male end of an adapter cable connector;
   a first pinch plate comprising a slot that corresponds with said at least one receiver slot, said first pinch plate mounted such that it can slide laterally along said interface unit;
   a second pinch plate comprising a slot that corresponds with said at least one receiver slot, said second pinch plate mounted such that it can slide laterally along said interface unit;
   at least one pair of opposing contact springs protruding through said first and second pinch plate slots; and
   an actuation mechanism connected to slide at least one of said pinch plates a distance in a lateral direction to change the position of said first pinch plate relative to said second pinch plate such that said contact springs are urged toward one another in said lateral direction.

2. The cable connector device of claim 1, said interface unit further comprising a plurality of guide grooves, each of said plurality of guide grooves being aligned with one of said receiver slots to facilitate insertion of an adaptor cable connector into said receiver slot.

3. The cable connector device of claim 2, wherein each of said guide grooves at a first end of said receiver slot has a first width, and wherein each of said guide grooves at a second end of said receiver slot opposite said first end has a second width, wherein said guide grooves having said first and second widths ensure adapter cable connector engagement in the proper orientation.

4. The cable connector device of claim 1, further comprising a slot frame, said slot frame comprising upper and lower portions, said portions comprising slits down the length of said portions, wherein said first and second pinch plates are housed within said slits such that said pinch plates are allowed to move back and forth in a lateral direction.

5. The cable connector device of claim 4, further comprising at least one return spring housed within said slot frame and arranged to urge at least one of said first and second pinch plates back to a full-open position when said actuation mechanism is inactive.

6. The cable connector device of claim 1, wherein said actuation mechanism is connected to slide said first and second pinch plates in opposite directions.

7. The cable connector device of claim 1, wherein said actuation mechanism comprises:
   at least one pneumatic cylinder; and
   a lever arm connected between said pneumatic cylinder and the end of one of said first and second pinch plates about a fulcrum, said lever arm arranged to apply a force to the end of one of said first and second pinch plates.

8. The cable connector device of claim 1, wherein said first and second pinch plates are in a full-open position when said actuation mechanism is inactive and a partial-closed position when said actuation mechanism is active.

9. The cable connector device of claim 1, wherein said opposing contact springs are configured to present a slight sliding contact against a male connector during engagement prior to activation of the actuation mechanism.

10. The cable connector device of claim 1, said actuation mechanism comprising a motor.

11. A wiring analyzer cabinet, comprising:
    a housing comprising at least one rack; and
    at least one interface unit in said at least one rack, said at least on interface unit comprising:
    an interface unit comprising at least one receiver slot shaped to receive a male end of an adapter cable connector;
    a first pinch plate comprising a slot that corresponds with said at least one receiver slot, said first pinch plate mounted such that it can slide laterally along said interface unit;
    a second pinch plate comprising a slot that corresponds with said at least one receiver slot, said second pinch plate mounted such that it can slide laterally along said interface unit;
    at least one pair of opposing contact springs protruding through said first and second pinch plate slots; and
    an actuation mechanism connected to slide at least one of said pinch plates a distance in a lateral direction to change the position of said first pinch plate relative to said second pinch plate such that said contact springs are urged toward one another in said lateral direction.

12. The wiring analyzer cabinet of claim 11, said interface unit further comprising a plurality of guide grooves, each of said plurality of guide grooves being aligned with one of said receiver slots to facilitate insertion of an adaptor cable connector into said receiver slot.

13. The wiring analyzer cabinet of claim 12, wherein each of said guide grooves at a first end of said receiver slot has a first width, and wherein each of said guide grooves at a second end of said receiver slot opposite said first end has a second width, wherein said guide grooves having said first and second widths ensure adapter cable connector engagement in the proper orientation.

14. The wiring analyzer cabinet of claim 11, further comprising a slot frame, said slot frame comprising upper and lower portions, said portions comprising slits down the length of said portions, wherein said first and second pinch plates are housed within said slits such that said pinch plates are allowed to move back and forth in a lateral direction.

15. The wiring analyzer cabinet of claim 14, further comprising at least one return spring housed within said slot frame and arranged to urge at least one of said first and second pinch plates back to a full-open position when said actuation mechanism is inactive.

16. The wiring analyzer cabinet of claim 11, wherein said actuation mechanism is connected to slide said first and second pinch plates in opposite directions.

17. The wiring analyzer cabinet of claim 11, wherein said actuation mechanism comprises:
   at least one pneumatic cylinder; and
   a lever arm connected between said pneumatic cylinder and the end of one of said first and second pinch plates about a fulcrum, said lever arm arranged to apply a force to the end of one of said first and second pinch plates.

18. The wiring analyzer cabinet of claim 11, wherein said first and second pinch plates are in a full-open position when said actuation mechanism is inactive and a partial-closed position when said actuation mechanism is active.

19. The wiring analyzer cabinet of claim 11, wherein said opposing contact springs are disposed to present a slight sliding contact against a male connector during engagement prior to activation of the actuation mechanism.

20. The wiring analyzer cabinet of claim 11, said actuation mechanism comprising a motor.

\* \* \* \* \*